United States Patent
Baecker

(10) Patent No.: US 8,389,444 B2
(45) Date of Patent: Mar. 5, 2013

(54) PROCESS OF FORMING A HIGH-TEMPERATURE SUPERCONDUCTOR

(75) Inventor: Michael Baecker, Cologne (DE)

(73) Assignee: BASF SE, Ludwigshafen (DE)

( * ) Notice: Subject to any disclaimer, the term of this patent is extended or adjusted under 35 U.S.C. 154(b) by 1130 days.

(21) Appl. No.: 12/177,995

(22) Filed: Jul. 23, 2008

(65) Prior Publication Data

US 2009/0088326 A1 Apr. 2, 2009

Related U.S. Application Data

(63) Continuation of application No. PCT/EP2007/005747, filed on Jun. 28, 2007.

(30) Foreign Application Priority Data

Jun. 29, 2006 (DE) .......................... 10 2006 029 947

(51) Int. Cl.
*H01L 39/24* (2006.01)
*H01B 12/00* (2006.01)

(52) U.S. Cl. ........ 505/470; 505/434; 505/472; 505/736; 505/737; 427/62; 427/123; 427/125; 427/217; 427/229; 252/512; 252/514; 205/51

(58) Field of Classification Search .................. 505/210, 505/220, 230, 300, 430, 470, 734, 736; 427/62, 427/117, 118, 125, 304, 305; 205/51, 138, 205/170, 224; 252/512–514; 106/1.22–1.26
See application file for complete search history.

(56) References Cited

U.S. PATENT DOCUMENTS

| | | | |
|---|---|---|---|
| 3,035,944 A | 5/1962 | Sher et al. | |
| 3,589,916 A | 6/1971 | McCormack | |
| 5,085,693 A | 2/1992 | Josso et al. | |
| 5,147,851 A * | 9/1992 | Yamana et al. | 505/220 |
| 5,747,178 A | 5/1998 | Sodervall et al. | |
| 6,002,951 A * | 12/1999 | Goland et al. | 505/220 |
| 6,669,774 B1 * | 12/2003 | Zhang et al. | 117/4 |
| 2003/0124259 A1 * | 7/2003 | Kodas et al. | 427/376.6 |
| 2004/0266628 A1 * | 12/2004 | Lee et al. | 505/238 |

FOREIGN PATENT DOCUMENTS

| | | |
|---|---|---|
| WO | 01/08233 A2 | 2/2001 |
| WO | 02/28527 A | 4/2002 |

* cited by examiner

*Primary Examiner* — Stanley Silverman
*Assistant Examiner* — Kallambella Vijayakumar
(74) *Attorney, Agent, or Firm* — Edell, Shapiro & Finnan, LLC

(57) ABSTRACT

A method of producing a thin layer, high-temperature superconductor strip is disclosed. In the method, a metal salt solution is formed and coated onto a substrate including a high-temperature superconductor layer. Heat is then applied directly or indirectly to the solution. The metal salt solution may contain a metal-organic salt solution or a metal inorganic metal salt solution. When an inorganic metal salt solution is utilized, a reducing solution may also be applied to the HTSC layer prior to heating. In addition, nano-sized metal particles may be added to the metal salt solution and/or the reducing solution.

29 Claims, No Drawings

PROCESS OF FORMING A HIGH-TEMPERATURE SUPERCONDUCTOR

CROSS REFERENCE TO RELATED APPLICATIONS

This application is a continuation of International Application No. PCT/EP2007/005747, filed on 28 Jun. 2007, entitled "Method for Applying a Metallic Covering Layer to a High-Temperature Superconductor," which claims priority under 35 U.S.C. §119 to Application No. DE 102006029947.7 filed on 29 Jun. 2006, entitled "Method for Applying a Metallic Covering Layer to a High-Temperature Superconductor," the entire contents of which are hereby incorporated by reference.

FIELD OF THE INVENTION

The present invention is directed toward a strip-shaped, high-temperature superconductor (HTSC) and, in particular, to the formation of an HTSC including a substrate, an HTSC layer, and a metal layer.

BACKGROUND

Strip-shaped high temperature superconductors (HTSC) typically include a metal substrate and an HTSC layer. The HTSC layer is a cuprate superconductor, mainly of a rare earth/barium/copper oxide compound (e.g., yttrium barium copper oxide (YBCO)). A pair of high temperature superconductors may be combined to form a neutral fiber conductor. To form a neutral fiber conductor, a thin metallic cover layer (called a cap) is applied onto each high temperature superconductor strip (and specifically, on the HTSC layer). Subsequently, the two metallic cover layers are soldered together. The combined metallic cover layers not only render the HTSC layer passive, but also act as an adhesion promoting primer.

Additional metal layers (e.g. copper) may be electroplated onto the metallic cover layer. In operation, the metallic cover layer must be applied to the HTSC layer prior to electroplating the metal layer. Otherwise, the HTSC layer would take part in the electro-chemical reaction, reducing its current-carrying ability. Since metallic cover layers are prepared utilizing physical methods such as sputtering (requiring the method to be performed under vacuum), these processes require a high outlay of apparatus, which is expensive.

Thus, it would be desirable to provide a process for producing HTSC strips having a cover layer that avoids the above-described problems.

SUMMARY

The present invention is directed toward a wet chemical process for forming a metallic cover layer on a high temperature superconductor (HTSC) strip. In the process, a substrate is coated with a high temperature superconductor layer, which, in turn, is coated with a metallic cover layer. The high-temperature superconductor layer includes not only a completed HTSC layer but also an HTSC precursor layer (i.e., an undoped HTSC layer). The metallic cover layer is formed from a metal salt solution. In one embodiment, the cover layer is formed from an organometallic salt solution. The organometallic salt solution is coated onto the HTSC layer and may then be heated to remove any residues present in the solution. In another embodiment, the metal cover layer may be formed from an inorganic metal salt solution. The inorganic metal salt solution is applied to the HTSC layer, and then a reducing solution is applied to the inorganic metal salt solution. The combined solutions may then be heated to remove any residues from the solution. In either embodiment, the metal salts may include noble metal ions such as silver, gold, platinum, or combinations thereof. In addition, nano-sized metal particles may be added to the metal salt solution and/or the reducing solution.

DETAILED DESCRIPTION OF THE INVENTION

The high-temperature superconductor (HTSC) strip is formed via wet-chemical application of the metallic cover layer. During the process, a metal-organic salt solution (an organometallic salt solution) or an inorganic metal salt solution is applied to an HTSC layer or an HTSC precursor layer. The metals contained in the solution (i.e., the contained metals) are deposited on the HTSC layer by either heating the solution (in the case the metal-organic salt solution) or by applying a reducing solution and subsequently heating the applied solutions (in the case the inorganic metal salt solution). Heating the metal salt solution or the metal salt/reducing agent solutions expedites the formation of the metal layer. In either case, the residues of the metal salt solution remaining on the metal layer after its preparation (i.e., the solvent and the remainder of the ligands of the respectively used metal salts) are removed from the metal layer by the application of heat, e.g., by decomposition, pyrolysis, and/or vaporization.

The substrate may include, but is not limited to, monocrystalline substrates or buffered metal substrate-strips.

The high-temperature superconductor layer includes not only a completed HTSC layer such as $YBa_2Cu_3O_{6.6}$, but also an HTSC precursor layer (i.e., an undoped HTSC layer) such as $YBa_2Cu_3O_6$.

While it is known to produce an HTSC-gold composite body by compacting HTSC particles previously coated with gold, this method is not practical when forming HTSC strips. In this process, a suspension of an $AuCl_3$ solution and HTSC particles is prepared, and then a gold layer is prepared on the HTSC particle by application of heat and the optional addition of a reducing agent. During the process, all the reaction products must be removed by filtration, which is not possible with strip-shaped HTSC. In addition, care must be taken that the used solvents are absolutely free of water; otherwise, a hydrochloric acid residue forms, which attacks the cuprate HTSC. Even if attention is given to this, later contact with water vapor contained in air unavoidably leads to a formation of hydrochloric acid. Even after filtration, chlorine-containing reaction products (residues) always remain on the HTSC particles. These residues attack the HTSC. However, when the method according to the invention is performed, no residues which attack the HTSC remain on the strip-shaped HTSC.

The metal salts may include noble metal ions such as silver ions, gold ions, platinum ions, and combinations thereof. The resulting metallic cover layer is particularly inert to environmental effects and does not attack the HTSC layer.

Nano-scale (nano-sized) metal particles may also be added to the metal salt solution and/or reducing solutions. Nano-scale metal particles possess a mean largest diameter of no more than about 120 nm. The nano-scale metal particles increase the thickness of the metal cover layer. In addition, the metal salt solution may be saturated, which also increases the thickness of the resulting cover layer. The concentration of the nano-particles in the coating solution may include an amount of up to 5% by weight. By way of specific example, the coating solution may include about 1-2% by weight nano-scale particles.

The metal-organic salt solution may include metal salts such as Me-(hexafluoroacetylacetonate)(1,5-cyclooctadiene); Me-pentafluoropropionate; Me-beta-diketonate; Me-carbonic acid salt; Me-NR—R; Me-$(CR_2)_n$—R; Me-CO—R; Me-COO—R; Me-CONR—R; and/or Me=CR—R, wherein Me is a noble metal, R is an organic residue, and n is the stoichiometric factor.

The inorganic metal salt solution may include metal salts such as Me-nitrate; Me-acetate; Me-citrate; Me-trifluoroacetate; Me-tartrate; and/or Me-OH. The reducing solution may include a reducing agent such as formaldehyde, hydrazine, a borane (e.g., dimethylamine-borane), and/or a sulfur compound. Some metal salts can also be reduced by urea. If the reducing solution contains merely formaldehyde as a reducing agent, then the ratio of metal to formaldehyde is preferably between about 1:1 and about 5:1. If the reducing solution contains merely dimethylamine-borane as a reducing agent, then the ratio of metal to dimethylamine-borane is preferably between about 1:2 and about 1:10.

Some metals (e.g., silver) are diffusion-permeable for $O_2$ at higher temperatures. Thus, if a diffusion-permeable metal is applied the HTSC layer or the HTSC precursor layer, then HTSC may be doped with $O_2$ before or after the application of the metallic cover layer. Partial doping before and partial doping after the application of the metallic cover layer is also possible.

The process may be selectively repeated in order to form a plurality of metallic cover layers over the HTSC layer (i.e., multiple coating cycles may be performed to form the metallic cover layer). In addition, different embodiments of the method according to the invention can be combined with each other. For example, a first metallic cover layer may be formed utilizing a metal-organic salt solution, applying it to the HTSC layer, and heating it to produce a first metallic cover layer. Subsequently, an inorganic metal salt solution followed by a reducing solution may be applied to the formed first metallic cover layer and then heated to accelerate the formation of the second metallic cover layer, evaporating excess solvent.

Additional metal layers may be applied to the metallic cover layer via electrochemical processes.

The application method for the metal-organic salt solution may include, e.g., dip-coating and inkjet coating. The amount of solution applied may include about 0.1 $\mu l/cm^2$ to about 10 $\mu l/cm^2$ (e.g., about 1 $\mu l/cm^2$). The temperature operable to evaporate and pyrolyze the volatile components in the metal-organic salt solution may include, but is not limited to, temperatures of about 300° C.-about 500° C.

Similarly, the method of applying the inorganic metal salt solutions may include dip-coating and inkjet coating. The inorganic metal salt solution may be applied in an amount including, but not limited to, 0.1-2 $\mu l/cm^2$. The temperature operable to evaporate and pyrolyze the volatile components in the inorganic metal salt solution and may include, but is not limited to, temperatures of about 40° C.-80° C.

The invention will now be described in greater detail on three examples of embodiment.

Each of the HTSC samples to be coated had a YBCO layer (thickness d ~300 nm) either on mono-crystalline substrates (STO (100)), or on buffered metal substrate-strips. The YBCO layers were prepared wet-chemically. Conventional methods for the preparation and/or coating of the YBCO layers and/or the buffered metal substrate may be utilized.

Example 1

As a coating solution, (1,5-cyclooctadiene)-(hexafluoroacetylacetonate)-silver(I), 99% (obtained from Sigma-Aldrich, ST. Louis, Mo.) in toluene for spectroscopy (obtained from Merck, Whitehouse Station, N.J.) having a concentration of about 1.5 M was used. The samples were prepared by means of dip-coating at a drawing-through speed of about 0.4 cm/s and with a residence time in the solution of up to 40 s. Alternatively, about 1 PI of the solution was applied on 1 $cm^2$ (possible being also about 0.5 $\mu l/cm$ to about 10 $\mu l/cm^2$) by means of the "ink jet" method, i.e. with a printing head operating according to the ink-jet principle. After each coating operation the volatile components were evaporated and pyrolyzed at about 300° C. within about 2 minutes. The first coating was a non-effaceable silver layer on the HTSC layer. The method was repeated up to three times. Thereby, an almost dense, i.e. closed, silver film was formed.

In a variant of the method, Ag nano-particles were suspended in the coating solution. The concentration of the nanoparticles in the coating suspension was up to 5% by weight. An optimal coating result was obtained for concentrations of 1-2% by weight. This concentration resulted in a closed metallic cover layer after only one coating cycle.

The variant of the method was tested on rectangular, so-called short samples as well as on strips. Following the coating operation, the strips were electrolytically plated with copper in a drawing-through procedure. As the electrolyte, a copper electrolyte acidified with sulfuric acid was used (copper sulfate corresponding to 50 g/l Cu; sulfuric acid corresponding to 25 ml/l; hydrochloric acid corresponding to 60 mg/l Cl). The plating operation was effected at a bath temperature of 15 to 40° C., preferably at 25° C. The current density was 0.3 or 0.5 kA/m 2. A residence time of 5 minutes in the bath resulted in layer thicknesses of 2 to 10 $\mu m$ copper. The layer is dense, but not optimally smooth and glossy. The plating result could be improved distinctly by the addition of leveling agents and brighteners such as thiourea, derivatives of thiocarboxylic acid, and/or polyglycol compounds in concentrations <0.1%. Thus, a layer of 3 $\mu m$ thickness was prepared which, despite the small thickness, was distinctly smoother and denser—i.e. more "free of gaps" than a copper layer of 8 $\mu m$ thickness prepared without the indicated additives.

Example 2

The coating operation was effected continuously on strip-shaped HTSC having a metal-strip substrate by means of two printing heads which each in direct succession applied a solution onto the surface of the respective HTSC according to the "inkjet" method. Via the first printing head, 0.1-2 $\mu l/cm^2$ of silver nitrate solution were applied on the substrate. Immediately following this, a reducing solution containing either formaldehyde (preferred ratio Ag/formaldehyde=2:1, possible is 1:1 to 5:1) or dimethylamine-borane (preferred ratio Ag/dimethylamine-borane=1:6, though possible ratios includes a range of from 1:2 to 1:10) was "printed" onto the strip-shaped HTSC via the second printing head, whereby the respective reducing solution was applied on the previously applied silver nitrate solution. Subsequently, the strip was dried by being continuously passed through a furnace first for 2 min (possible is 0.5 to 4 min) at a temperature of 60° C. (possible is 40-80° C.), and subsequently for 5 min (possible is 3-15 min) at 150° C. (possible is 100-210° C.). In this manner, a dense, non-effaceable silver layer of 0.2-3 µm, depending upon the concentration and amount of the applied silver nitrate solution is obtained. The use of a saturated, non-acidified silver nitrate solution proved to be optimal.

To lessen the amounts of soluble components, and to obtain a dense cover layer more rapidly, nano-scaled particles can be added to the second applied solution, i.e. the reducing solution, in a concentration of up to about 5% by weight (optimally about 1% by weight). While Ag and Cu are exemplary, other metals or alloys are also possible, for example noble metals or noble metal alloys.

As an electrochemical final coating operation, plating with copper according to Example 1 was performed; alternatively, plating with nickel could also be performed. The results of plating with copper corresponded to those of the first example of embodiment. For the electrochemical plating with nickel, an electrolyte on a nickel sulfamate basis was chosen (nickel sulfamate corresponding to 100 g/l Ni; nickel chloride corresponding to 25 g/l Cl; boric acid 40 g/l). The pH value of the electrolyte was adjusted with boric acid to be between about 3.5 and about 4.5. The plating operation was effected at a bath temperature of 60° C. A value of 65° C. should not be exceeded. The current density was between about 0.5 kA/m$^2$ and about 2 kA/m$^2$. With a residence time of 3-5 minutes in the bath, nickel layer thicknesses of 2 to 30 µm were obtained. The homogeneity of the layers can be improved by the addition of wetting agents (approximately 1 ml/l). In general, lower current strengths <0.6 kA/m$^2$ and longer residence times lead to layers which are harder and more glossy, i.e. very depleted of pores. A current strength of 0.5 kA/m$^2$ with a residence time of about 5 min corresponding to a nickel layer thickness of about 5 µm proved to be optimal.

Example 3

The coating operation was performed on an yttrium-barium-copper oxide layer which was already crystallized, but had not yet been subjected to loading with oxygen. Accordingly, the YBCO layer is not yet doped, and therefore anti-ferromagnetic. As a coating solution, (1,5-cyclooctadiene)-(hexafluoroacetyl-acetonato)-silver(I), 99% (obtained from Sigma-Aldrich, St. Louis, Mo.) in toluene for spectroscopy (obtained from Merck, Whitehouse Station, N.J.) with a concentration of about 1.5 M was used. The samples were prepared by means of dip-coating at a drawing-through speed of about 0.4 cm/s, and with a residence time in the solution of up to 40 s. Alternatively, about 1 µl of the solution was applied on 1 cm$^2$ (possible being also about 0.5 to about 10 µl/cm$^2$) by means of an "ink jet" method, i.e., with a printing head operating according to the ink-jet principle. After each coating operation, the volatile components were evaporated. The subsequent pyrolysis was effected at temperatures of 500° C. within 2 h. With this pyrolysis, a charging with oxygen of the yttrium-barium-copper oxide layer is also effected. The first coating was a non-effaceable silver layer on the HTSC layer. The method was repeated up to three times. Thereby, a substantially dense, i.e., closed, silver film was formed.

While the present invention has been described in detail and with reference to specific embodiments thereof, it will be apparent to one skilled in the art that various changes and modifications can be made therein without departing from the spirit and scope thereof. For example, the residues may be removed by the direct or indirect application of heat. In addition, while the residues remaining after the preparation of the metal layer may be removed by heat, the residues may also be removed by heating from the layer intended for high-temperature superconduction. Thus, it is intended that the present invention covers the modifications and variations of this invention provided they come within the scope of the appended claims and their equivalents.

What is claimed is:

1. A method for producing a strip-shaped HTSC, the method comprising:
    (a) obtaining a substrate;
    (b) forming a high temperature superconductor layer on the substrate; and
    (c) forming a metal cover layer having a thickness of from 0.2 µm to 3 µm on the high temperature superconductor layer utilizing a wet chemical process, the wet chemical process including:
        (c.1) forming a metal salt solution including a metal salt,
        (c.2) applying the metal salt solution to the high temperature superconductor layer, and
        (c.3) heating the metal salt solution at a temperature of from 300° C. to 500° C. to remove any residues of the salt solution from the metal layer.

2. The method according to claim 1, wherein the metal salt comprises a metal-organic salt.

3. The method according to claim 2, wherein the metal-organic salt is selected from the group consisting of Me-(hexafluoroacetylacetonate)(1,5-cyclooctadiene); Me-pentafluoro-propionate; Me-beta-diketonate; Me-carbonic acid salts; Me-NR—R; Me-(CR$_2$)$_n$—R; Me-CO—R; Me-COO—R; Me-CONR—R; Me=CR—R; and combinations thereof, wherein Me is a noble metal, R is an organic residue, and n is a stoichiometric factor.

4. The method according to claim 1, wherein:
    the metal salt comprises an inorganic metal salt;
    (c.2) further comprises applying a reducing solution onto the metal salt solution; and
    (c.3) comprises heating the inorganic metal salt and reducing solutions at a temperature effective to accelerate the formation of the metal layer.

5. The method according to claim 4, wherein the inorganic metal salt is selected from the group consisting of Me-nitrate; Me-acetate; Me-citrate; Me-tartrate; Me-trifluoroacetate; MeOH; and combinations thereof, wherein Me is a noble metal.

6. The method according to claim 4, wherein the reducing solution comprises a reducing agent selected from the group consisting formaldehyde; hydrazine; a borane; urea; a sulfur compound; and combinations thereof.

7. The method according to claim 4, wherein:
    the reducing solution comprises a formaldehyde; and
    the ratio of metal to formaldehyde is between about 1:1 and about 5:1.

8. The method according to claim 4, wherein:
    the reducing solution comprises a dimethylamine-borane; and
    the ratio of metal to dimethylamine-borane is between about 1:2 and about 1:10.

9. The method according to claim 4, wherein the reducing solution further comprises nano-sized metal particles selected from the group consisting of silver, gold, platinum, and combinations thereof.

10. The method according to claim 1, wherein (c.3) comprises (c.3.1) heating the metal salt solution in an atmosphere enriched with oxygen.

11. The method according to claim 1 further comprising:
    (c.4) applying an additional metal salt solution layer to the formed metal layer; and
    (c.5) heating the additional metal salt solution layer.

12. The method according to claim 1, wherein the metal salt solution comprises at least one of silver ions, gold ions, and platinum ions.

13. The method according to claim 1, wherein the metal salt solution further comprises nano-scaled metal particles.

14. The method according to claim 13, wherein the nano-scaled metal particles are selected from the group consisting of silver, gold, platinum, and combinations thereof.

15. The method according to claim 1, wherein the metal salt solution is saturated.

16. The method according to claim 1, further comprising (d) applying an additional metal layer to the formed metal layer.

17. The method according to claim 16, wherein (d) comprises (d.1) electrochemically applying the additional metal layer to the formed metal layer.

18. The method according to claim 17, wherein (d.1) comprises:
- (d.1.1) applying an electrolyte including ions selected from the group consisting of copper ions, noble metal ions, nickel ions, iron ions, tin ions, zinc ions, phosphor ions, and combinations thereof; and
- (d.1.2) applying the electrolyte via electrochemical deposition.

19. The method according to claim 1, wherein the high-temperature superconductor layer is doped with $O_2$ before the metal layer is formed.

20. A method for producing a strip-shaped HTSC, the method comprising:
- applying a high-temperature superconductor layer to a substrate;
- forming a metal cover layer on the high-temperature superconductor layer utilizing a wet chemical process including:
  - applying a metal-organic salt solution to the high temperature superconductor layer, the metal organic salt solution including an organic metal salt selected from the group consisting of Me-(hexafluoroacetylacetonate)(1,5-cyclooctadiene), Me-penta-fluoro-propionate, Me-beta-diketonate, Me-carbonic acid salts, Me-NR—R, Me-$(CR_2)_n$—R, Me-CO—R, Me-COO—R, Me-CONR—R, Me=CR—R, and combinations thereof, wherein Me is a noble metal, R us an organic residue, and n is a stoichiometric factor,
  - heating the metal-organic salt solution at a temperature of about 300° C. to about 500° C. to evaporate and pyrolyze volatile components present in the solution and to form the metal cover layer.

21. The method according to claim 20, wherein:
the metal-organic salt solution further comprises metal particles selected from the group consisting of silver, gold, platinum, and combinations thereof; and
the metal particles possess a mean diameter of up to about 120 nm; and
the metal particles are present in the metal organic salt solution in an amount of up to 5% by weight.

22. The method according to claim 20, wherein:
the metal cover layer is a first portion of the metal cover layer; and
forming the metal cover layer further comprises:
- applying an inorganic metal salt solution to the first metal layer, the inorganic metal salt solution including an inorganic metal salt selected from the group consisting of Me-nitrate, Me-acetate, Me-citrate, Me-tartrate, Me-trifluoroacetate, MeOH, and combinations thereof, wherein Me is a noble metal;
- applying a reducing solution to the inorganic metal salt solution, the reducing solution comprising a reducing agent selected from the group consisting of formaldehyde, hydrazine, borane, urea, a sulfur compound, and combinations thereof; and
- heating the inorganic metal salt and reducing solutions to form a second metal cover layer.

23. The method according to claim 20, wherein:
the high temperature superconductor layer is an undoped high temperature superconductor layer; and
the method further comprises doping the high temperature superconducting layer before or after application of the metal cover layer.

24. A method for producing a strip-shaped HTSC, the method comprising:
- applying a high-temperature superconductor layer to a substrate;
- forming a metal cover layer onto the high temperature superconductor layer utilizing a wet chemical process, the wet chemical process including:
  - applying an inorganic metal salt solution to the high temperature superconductor layer, the inorganic metal salt solution including an inorganic metal salt selected from the group consisting of Me-nitrate, Me-acetate, Me-citrate, Me-tartrate, Me-trifluoroacetate, MeOH, and combinations thereof, wherein Me is a noble metal,
  - applying a reducing solution to the inorganic metal salt solution, the reducing solution comprising a reducing agent selected from the group consisting of formaldehyde, hydrazine, borane, urea, a sulfur compound, and combinations thereof, and
  - heating the applied inorganic metal salt and reducing solutions to evaporate and pyrolyze volatile components present in the solutions, forming the cover layer.

25. The method according to claim 24, wherein:
the reducing solution further comprises metal particles selected from the group consisting of silver, gold, platinum, and combinations thereof;
the metal particles possess a mean diameter of up to about 120 nm; and
the metal particles are present in the reducing solution in an amount of up to 5% by weight.

26. The method according to claim 24, wherein the formed cover layer possesses a thickness of from 0.2 μm to 3 μm.

27. The method according to claim 24, wherein the inorganic metal salt and reducing solutions are heated to a temperature of about 40° C. to 80° C.

28. The method according the claim 24, wherein the heating step comprises:
heating the inorganic metal salt and reducing solutions to a first temperature, the first temperature falling within a range of 40° C. to 80° C.; and
heating the inorganic metal salt and reducing solutions to a second temperature, the second temperature falling within a range of 100° C. to 210° C.

29. The method according to claim 24, wherein:
the high temperature superconductor layer is an undoped high temperature superconductor layer; and
the method further comprises doping the high temperature superconducting layer before or after application of the metal cover layer.

* * * * *